United States Patent
Wen et al.

(10) Patent No.: US 6,221,427 B1
(45) Date of Patent: *Apr. 24, 2001

(54) INTERFACE REGIONS BETWEEN METAL AND CERAMIC IN A METAL/CERAMIC SUBSTRATE

(75) Inventors: Sheree Hsiao-Ru Wen, Briarcliff Manor; Carl Stephen Wood, Hyde Park, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/787,412

(22) Filed: Jan. 22, 1997

Related U.S. Application Data

(63) Continuation of application No. 07/780,665, filed on Oct. 18, 1991, now Pat. No. 5,682,018.

(51) Int. Cl.$^7$ ........................................................ B05D 5/12
(52) U.S. Cl. ........................ 427/96; 427/372.2; 427/379; 427/126.2; 427/383.5
(58) Field of Search .................................. 427/97, 372.2, 427/379, 126.2, 383.5, 96

(56) References Cited

U.S. PATENT DOCUMENTS 3,844,830 * 10/1974 Spielberg et al. ................ 117/160 R
4,234,367 * 11/1980 Herron et al. .......................... 156/89

* cited by examiner

*Primary Examiner*—Brian K. Talbot
(74) *Attorney, Agent, or Firm*—Daniel P. Morris

(57) ABSTRACT

Structures, and methods of fabrication thereof, are described wherein between an electrically conducting region and a ceramic region there is an interface region which has a thermal coefficient of expansion which is intermediate between the thermal coefficient of expansion of the conducting region and the ceramic region. This interface region substantially avoids separation of the adhesion of the conducting region from the ceramic region and avoids the creation of voids therebetween. The interface region is preferably a mixture of metal particles and ceramic material. The interface region is created by sintering alternately in oxidizing and reducing atmospheres which results in metal particles being disposed away from the metal body about the periphery or the metal body within the ceramic material.

19 Claims, 2 Drawing Sheets

INTERFACE REGIONS BETWEEN METAL AND CERAMIC IN A METAL/CERAMIC SUBSTRATE

This is a division of application Ser. No. 07/780,665, filed Oct. 18, 1991, now U.S. Pat. No. 5,682,018.

TECHNICAL FIELD

The present invention relates to structures, and methods of fabrication thereof, having an interface region between metal and ceramic regions wherein the interface region has a temperature coefficient of expansion, intermediate of the metal and ceramic regions, which substantially prevents separating of the metal and ceramic regions during temperature cycling of the structure. More particularly, the interface region is a mixture of particles of the metal and particles of the ceramic. Most particularly, the present invention relates to a multilayer metal/ceramic electronic packaging substrate, and methods of formation thereof, containing metal patterns having an interface layer between the metallization pattern and the ceramic wherein the interface layer is a mixture or metal particles and ceramic particles which forms a hermetic seal between the metal patterns and the ceramic capable of withstanding thermal cycling during fabrication and use. Additionally, more particularly, the present invention relates to a method of fabricating the interface region wherein a combination of a metal paste in a green ceramic precursor is alternatively sintered in oxidative and reductive atmospheres.

BACKGROUND OF THE INVENTION

Multilayered ceramic circuit substrates contain patterned metal layers which act as electrical conductors sandwiched between ceramic layers which act as electrical insulators. These ceramic substrates are formed by laminating together thin green sheets of glass particles or an admixture of glass and crystalline particles mixed with binders and patterns of paste containing metal particles mixed with binders for forming conductors between, the ceramic greensheet. This green laminate is fired to burn off the binder materials, fired to coalesce the particles to a dense state further fired if necessary to crystallize the densified glass particles or to further crystallize the admixture of glass and crystalline particles to form an insulator and to coalesce the metal particles to form conducting metal lines.

Terms such as ceramic and glass ceramic are often used interchangeably in the art. To avoid confusion for the purpose of this application the following definitions will be used. The term ceramic has the following meaning: an aggregate of randomly oriented crystallines wherein the interstices between crystallines may contain uncrystallized material such as glass. The terms coalescence or densification refer to a heat treatment to reduce the density of pores in greensheets. The term crystallization refers to further heating after coalescence or densification or to heating if there is no coalescence or densification step to form crystallites from a glass. The term sintering refers to the heat treatment required to form the final ceramic. Sintering of a greensheet of an admixture of glass particles and crystalline particles is a heat treatment to coalesce or densify the greensheet plus a crystallizing heat treatment only if further crystallization is required. The term sintering temperature means, for a green sheet requiring crystallization, the crystallization temperature. The term sintering temperature means, for a greensheet not requiring crystallization, the coalescence temperature. Substrates made of ceramics requiring high temperatures for particle coalescence and densification, such as alumina, restrict the choice of co-sinterable conducting metallurgics to high melting point metals, for example refractory metals, such as molybdenum, tungsten, platinum, palladium or a combination of these with each other or certain other metals and precludes the use or preferable electrical conductors such as gold, silver and copper which have melting points less than the alumina sintering temperature. Alumina is a good insulator, has high thermal conductivity and has good strength. The dielectric constant of alumina is about 10.

Materials often referred to as glass-ceramics have been intensively studied in recent years for use as circuit substrates. These ceramics generally have low dielectric constant, a low thermal coefficient of expansion which is close in value to silicon and a low sintering temperature. The low sintering temperature permits the use of low melting point metals, such as copper and noble metals, for electrical conductors. Noble metals have low resistives comparable to copper. However, copper is less expensive and, therefore, its use substantially reduces manufacturing cost. When an oxidizable metal, such as copper, silver, molybdenum is used as the electrical conductor, it is necessary that thermoplastic organic binder materials contained within the green sheet used to form the ceramic and contained within the paste used to form the copper conductors be depolymerized and burned out in an atmosphere and at a temperature wherein the copper is not substantially oxidized.

Failure to burn out binders results in less than desirable ceramic properties. For example, if the binder is not fully burned out, residual carbon is left in the sintered ceramic which modifies the ceramic dielectric constant and inhibits complete densification. With only 0.1% residual carbon content the ceramic may be black having an apparent dielectric constant greater than 1000 and, rather than being an insulator, the fired ceramic will be a semiconductor. An oxidizing atmosphere is generally needed to burn out the binder.

Removal of the binder is complicated by the additional requirement that the burn-out ambient not excessively oxidize the oxidizable metal lines and planes. If the metal is excessively oxidized, the metal oxide diffuses into the ceramic and changes the dielectric properties of the ceramic. Also, when metal is excessively oxidized it expands causing stress within the green laminate which can result in delamination and cracking of the green laminate. Such cracks may not be removed by the sintering heat treatment thereby resulting in a ceramic weakened by cracks.

Quite surprisingly, applicants have discovered that by controlling the oxidation and reduction (dioxidation) of the metal lines this cracking can be avoided while providing substantial improvement in the interface region between the metal and ceramic as described herebelow.

Two references generally describing binder burn-out and the fabrication of ceramics are U.S. Pat. No. 4,234,367 to Herron et al. and U.S. Pat. No. 4,504,339 to Kamehara et al., the teachings of both of which are incorporated herein by reference.

Herron et al. U.S. Pat. No. 4,234,367 describes a method for forming sintered ceramic substrates containing multilevel, interconnected circuit patterns of copper-based conductor films obtained by heating the green laminate composed of particles of crystallizable glass in an ambient of hydrogen and water to a burn-out temperature of about 700° C. to 800° C. at a rate of 1° C. to 3° C. per minute. A lower burn-out temperature would take a prohibitively excessive amount of time for carbon removal. The binder burn-out time is about 11 hours as is apparent from FIG. 4 of the Herron et al. patent. This time is needed: 1) to avoid bloating of the ceramic article caused by entrapped volatile products which cause the article to expand instead of contracting on sintering, 2) to fully oxidize carbon in the binders, 3) to avoid drastic volume changes in the copper conductor resulting from the copper-oxide formation, and 4) to maintain reducing to neutral conditions for copper. After the binder is burned out the laminate is sintered in a neutral atmosphere to form the ceramic material by first heating to coalesce the laminate to dense state and thereafter heating to form crystals from the densified glass particles. During binder burn-out Herron et al. encountered difficulties alternating air and forming gas for purposes of oxidizing copper and reducing any formed copper oxide to copper without drastic volume changes resulting from the copper oxide formation. Applicants have discovered that by alternating environments after burn out interfacial region of controlled thickness can be formed. U.S. Pat. No. 4,504,399 to Kamehara et al. describes a method for forming sintered ceramic substrates containing multilevel, interconnected circuit patterns of copper-based conductor films from a green laminate composed of an admixture particles of glass and particles of crystallites. Binders are burned-out by firing the substrate in a controlled ambient of an inert atmosphere, e.g. nitrogen, containing water vapor at a partial pressure from 0.005 to 0.3 atmospheres at a temperature between 550° C. and 650° C. for a time sufficient to burn out the binders in the green laminate and thereafter raising the temperature in an inert atmosphere without water to the sintering temperature to coalesce the green laminate to form the ceramic. The binder burn-out time is about 8 hours as is apparent from FIG. 2 of the Kamehara et al. patent. The burn-out temperature upper bound is limited to 650° C. because if the burn-out temperature used were higher, the glass components of the green sheets would begin to coalesce hindering further binder removal.

Both the patent to Kamehara et al. and the patent to Herron et al. teach burning out binders in an atmosphere sufficient to oxidize the binder but insufficient to oxidize the embedded copper conductors. It has been found that following methods such as these results in separation of the metal patterns from the ceramic material in the fully sintered ceramic structures. Also, after thermal cycling of the fully sintered structure over the use temperatures of a semiconductor chip package substrate of about 0° C. to about 125° C., these existing separations can be exacerbated and new separations, not previously existing can occur. These separations can occur around metal lines within a metallization layer of the multilayer structure or around the metal vias which pass through the individual ceramic sheets to electrically connect conductive metal patterns on adjacent metallization layers. These separations arc undesirable since they structurally weaken the multilevel metal/ceramic structure, they weaken the adhesion of the metal patterns to the ceramic material, they provide regions within which residual chemicals used in processing can accumulate as a source of contamination and they permit the external atmosphere to penetrate the structure possibly causing corrosion therein.

It is an object of the present invention to provide a metal embedded within a fully sintered ceramic wherein the interface between the ceramic and metal is substantially free of voids.

A method of the present invention forms sintered ceramic substrates containing multilevel, interconnected circuit patterns of metal conductor films obtained by first firing in an inert atmosphere to drive out (or volatilize) most of the binder, thereafter firing on an oxidizing atmosphere, preferably an oxygen containing atmosphere, to burn out the residual binder, thereafter firing in a reducing atmosphere, preferably a hydrogen containing atmosphere. Firing in the oxidizing atmosphere and the reducing atmosphere can be repeated as many times as necessary.

U.S. Pat. No. 4,627,160 to Heron et al. is directed to adding catalyst to facilitate binder removal and states at Column 4, lines 7–16 that various efforts were made to completely remove the binder and that difficulties were encountered with various neutral or reducing atmospheres which include alternative air and forming gas to oxidize carbon or reduce copper oxide without drastic volume changes resulting from copper oxide formation. Applicants have discovered that by alternative oxidizing and reducing atmospheres and controlling the temperatures and length of time in these atmospheres these undesirable results can be substantially eliminated.

U.S. Pat. No. 4,050,956 to deBruin et al. describes bonding a refractory oxide ceramic to a metal by heating in air to a temperature below the melting temperatures of the metal and ceramic to cause for some metals a chemical reaction therebetween to form a bond therebetween which is not microscopically observable, the reaction zone being less than about 250 Å and to form for other metals a metal/ceramic interface having a sharp discontinuity over which there is evidence of diffusion of metal into the ceramic. Furthermore, ceramic/metal/ceramic couples were prepared by sandwiching a metal foil between the flat faces of two ceramic discs to which a slight pressure was applied which the couple was held at an elevated temperature. In contradistinction, according to the present invention a microscopically observable interface region is fabricated between a metal and ceramic by heating alternatively in oxidizing and reducing atmospheres wherein the interface region contains microscopically observable, metal particles embedded in the ceramic.

EPO Published Patent Application No. 2 676 602, published May 18, 1988 describes burning out binders in a multilayered laminate by raising it from ambient to burn out temperature in an atmosphere by nitrogen gas containing oxygen. Residual carbon is burned out by maintaining the burn out temperature for several hours in an atmosphere of nitrogen gas containing hydrogen. In contradistinction, according to the present invention the oxidizing and reducing atmospheres are alternated for short period times to build up an interface region of metal particles embedded within the ceramic material.

U.S. Pat. No. 4,885,038 describes coating copper conductors with a polymeric coating to permit binder burn out in oxygen without oxidizing the copper conductors. Residual coating is removed after burn-out during sintering in a forming gas atmosphere.

U.S. Pat. No. 4,795,512 to Nakatani et al. describes forming a multi-layer ceramic having copper conductors by laminating PbO containing ceramic green sheets with pattern of copper oxide paste therebetween. The laminate is fired in an oxygen containing atmosphere to burn out binders. Since the copper forming past contains copper oxide there is no substantial further oxidation and consequently no substantial volumetric expansion as a result of oxidization. Thereafter, the laminate is fired at a temperature below the melting temperature of the ceramic, in an atmosphere of nitrogen containing hydrogen to reduce the copper oxide paste to copper but under conditions not sufficient to reduce the PbO in the green sheets. Thereafter, the laminate is fired in nitrogen to form a ceramic containing copper conductors. Since the paste contains copper oxide it appears that the paste under the heat treatments in reducing atmosphere coalesces into a copper conductor. There is no teaching of an interface region between the conductors and the ceramic. In contradistinction, according to the present invention, an interface region is fabricated by alternately treating a laminate to oxidizing and reducing atmospheres.

U.S. Pat. No. 4,863,683 to Nakatani et al. describes a process similar to that of U.S. Pat. No. 4,795,512 except that the ceramic is free of PbO. These are directed to burn out of binders in air which generally would cause complete oxidation of copper conductors which on sintering in a reducing environment would leave copper particles within the ceramic, thereby increasing its dielectric constant. To avoid or limit this oxidation zinc is added to the copper to avoid or substantially limit the oxidation of the conductors during burn out in air so that copper particle movement into the ceramic is eliminated or substantially limited. In contradistinction applicants have discovered that the generation of metal particles about a conductor in a ceramic can be beneficial if the metal particles are confined to a thin interface region. The interface region has a TCE intermediate of the ceramic and conductor TCEs which substantially avoids separation of the conductor and ceramic and cracking of the interface region during thermal cycling of the structure.

Firing in the oxidizing atmosphere both burns out the residual binder and oxidizes the surface of the metal patterns. Since there is a volumetric increase upon formation of the metal oxide, the oxidized surface of the metal grows outward into the surrounding ceramic. When the oxidized metal surface is exposed to the reducing atmosphere, the metal oxide is reduced leaving metal particles in the ceramic surrounding the metal pattern. The oxidation step must be controlled so as not to expand the oxidized metal pattern surface too much, since excess oxidation can form cracks in the green ceramic sheets which are not annealed out by the subsequent full sintering of the metal/ceramic structure. Prior to full sintering the ceramic is porous since it has not been fully densified. The pores provide passages for the oxidizing and reducing atmospheres to penetrate into the structure. In order to create a sufficiently thick intermediate region around the metal patterns and in order not to crack the green ceramic around the metal patterns, multiple oxidation/reduction cycles may be necessary. This depends on the type of materials for the conducting patterns and the ceramics. With each oxidation/reduction cycle more metal particles are disposed about the periphery of the metal pattern and the metal particles are disposed further away from the metal pattern. The oxidation/reduction cycles are controlled so as not to dispose metal particles throughout the ceramic since to do so will increase the dielectric constant between the adjacent metal lines, thereby increasing the capacitive coupling there between. In a final step the metal/ceramic structure is fully sintered and densified. The pores within the ceramic are closed, leaving a region around the metal patterns containing a mixture of metal particles within a fully sintered ceramic matrix which is substantially the same ceramic material as the surrounding ceramic material and integral therewith. The final sintering step is preferably done under pressure to push ceramic material into the pores of the intermediate region. The intermediate region or collar around the metal patterns has a thermal coefficient of expansion (TCE) which is intermediate between that of the metal and that of the ceramic. It has been found that of metals disposed within a ceramic without the intermediate region, the metal will separate from the ceramic because of the difference in TCE between the metal and the ceramic. The intermediate region avoids this problem.

It is an object of the present invention to provide an interface between an electrically conducting region and a ceramic region wherein the interface is capable of withstanding differential expansion between the metal and ceramic regions as a result of thermal cycling of the structure.

It is another object of the present invention to provide an interface region which is a combination of particles of an electrically conducting material embedded within a ceramic.

It is another object of this invention to provide an interface region wherein the electrically conducting particles are the same metal material as the electrically conducting region and wherein the ceramic in the interface region is the same ceramic as the ceramic region of the structure and wherein the ceramic in the interface region forms a unitary structure with the ceramic region.

It is another object of the present invention to fabricate a structure having an interface region by sintering an electrical conductor forming composition embedded within a green ceramic precursor, alternately in an oxidizing and a reducing atmosphere.

It is another object of the present invention to repeat the oxidizing and reducing atmosphere sintering treatment as many times as necessary to form the interface region.

These and other objects, features and advantages of the present invention will be readily apparent to those of skill in the art from the following detailed description and the drawings appended thereto.

SUMMARY OF THE INVENTION

A broad aspect of the present invention is a structure having a ceramic region and an electrically conducting region disposed together with an interface region layer between. The interface region is a mixture of particles of ceramic material and particles of electrically conducting material.

In a more particular aspect of the present invention, the interface region has a thermal coefficient of expansion intermediate between the metal and ceramic regions.

In another more particular aspect of the present invention, in the interface region of the particles of electrically conducting material arc embedded within a ceramic matrix.

In another more particular aspect of the present invention, the ceramic matrix is of the same material as the ceramic portion of the structure and the particles of the conducting material in the interface region are the same material as the conducting portion of the structure.

In another more particular aspect of the present invention, ceramic matrix of the interface is unitary with the ceramic material of the ceramic portion of the structure.

In another more particular aspect of the present invention, the electrically conducting region of the structure is embedded within the ceramic portion of the structure and the interface region substantially surrounds the electrically conducting region.

In another more particular aspect of the present invention, the structure is a semiconductor chip packaging substrate, wherein the electrically conducting regions are metal lines and vias in electrical connection with input-output terminals of an electronic device.

Other broad aspects of the present invention are methods of forming the interface region of the structure of the present invention wherein a conductor forming region is disposed in contact with a green ceramic precursor and wherein this combination is exposed to at least one cycle of exposure to an oxidizing atmosphere and a reducing atmosphere.

In another more particular aspect of the method of the present invention, the oxidizing atmosphere contains oxygen, and the reducing atmosphere contains hydrogen.

In another more particular aspect of the present invention, in a final sintering step the structure being sintered is subjected to pressure result in a substantially pore-free interface region which is a densified mixture of particles of electrically conducting material surrounded by ceramic material.

DETAILED DESCRIPTION

Figure 1:
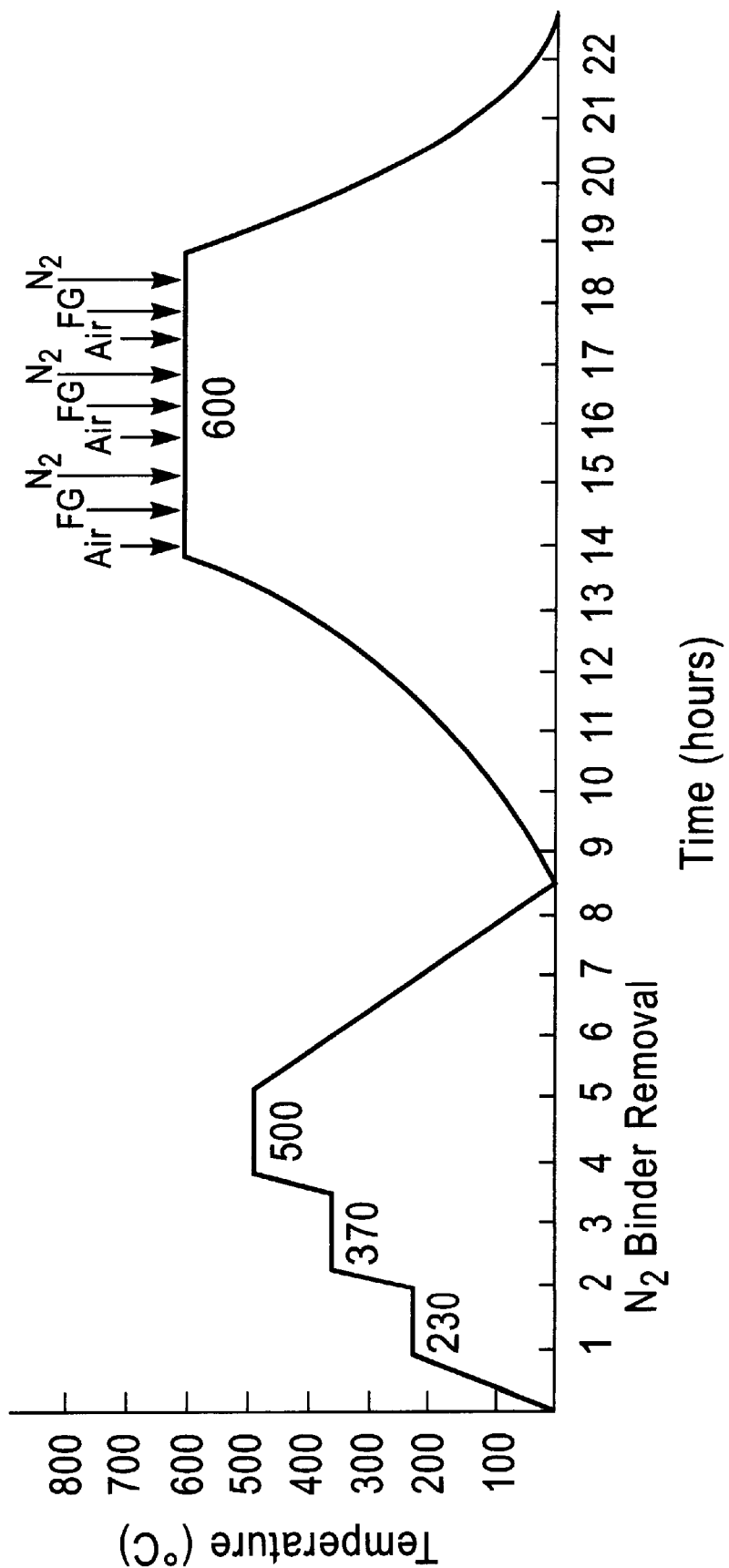
FIG. 1 shows an example of a firing schedule according to the present invention.

It was discovered, in accordance with this invention that binders in green sheets of glass particles or an admixture of glass and crystalline particles used to form a sintered ceramic article and binders in a metal based paste used to form conductors within the sintered article can be burned out in a cyclic ambient alternatively between an oxidizing atmosphere and a reducing atmosphere while controlling oxidation of the surface of the metal based conductors. Metals for metal based conductor forming paste are selected from the group consisting of gold, silver, copper, molybdenum, platinum and palladium. This list is exemplary only and not limiting. A ceramic composite structure formed by the method of the present invention is useful as a substrate on which a semiconductor chip is mounted to provide electrical connection of device and circuit elements on such semiconductor chip to a support structure, such as a printed circuit board to which the substrate is electrically connected. The ceramic substrate can be a multichip substrate.

The composite structure is formed from at least one green sheet, comprised of a thermoplastic organic binder having dispersed within the binder particles of a crystallizable glass or an admixture of glass particles and crystalline particles. Commonly used ceramic binders are Butvar (registered trademark of Monsanto, Inc.) polyvinyl butyral and polyvinyl acetate. Such binders are exemplary only and not limiting. The sintering temperature of the green sheet is less than the melting point of the metal-based metallurgy which forms conductors within the composite structures. The sintering temperature of an admixture of glass and crystalline particles is the coalescence temperature if no further crystallization is required or the crystallization temperature if further crystallization is required.

Examples of crystallizable glasses, useful for practicing the present invention, are disclosed in U.S. Pat. No 4,301,324 to Kumar et al. and the process for making such ceramic structure is disclosed in U.S. Pat. No. 4,413,061 to Kumar et al. The teachings of both patents are incorporated herein by reference. The disclosed ceramic structures are characterized with low dielectric constants and are compatible with circuitry of copper-based metallurgy co-sinterable therewith. These glasses have crystallization temperature in the range of about 850° C. to 970° C.

Of the two types of ceramics disclosed in the aforesaid patent U.S. Pat. Nos. 4,301,324 and 4,413 061, one has spodumenie, $Li_2O-Al_2O_3-4SiO_2$, as the principal crystalline phase while the other was cordierite, $2MgO\ 2Al_2O_3\ 5SiO_2$, as the principal crystalline phase. A common feature of these sintered ceramics, among others, is their excellent sinterability and crystallization below 1000° C.

The terms spodumene glass and cordierite glass as used herein refer to the uncoalesced and uncrystallized glass particles. The terms spodumene ceramic and cordierite ceramic as used herein refer to the coalesced and crystallized ceramic.

The multilayered ceramic of the present invention includes, but is not limited to, the spodumene ceramics and cordierite ceramics as described in the Kumar et al. patents.

Other ceramic materials suitable for practicing the present invention include but are not limited to eucryptite, borosilicate glass, lead glass, enstatite, celsian, wollastonite, willemite, anorthite, lithium disilicate, lithium metasilicate, mullite, combinations thereof and combinations thereof with alumina. This list is exemplary only and not limiting.

The following is a list of the general formula for the predominant components of the materials mentioned above:
celsian, $BaO-Al_2O_3-2SiO_2$
anothite, $CaO-Al_2O_3-2SiO_2$
lithium disilicate, $Li_2O_6-2SiO_2$
lithium metasilicate, $Li_2O-SiO_2$
wollastinite, $CaO-SiO_2$
willemite, $2ZnO.-SiO_2$
eucriptite, $Li_2O-2SiO_2$
mullite, $3Al_2O_3-2SiO_2$
enstatite, $MgO-SiO_2$ On the surface of the green sheet is deposited a pattern of a metal-based conductor forming composition which includes a metal paste binder, for example ethylcellulose. A second green sheet is superimposed on the first sheet to sandwich the conductor pattern therebetween. The sheets are laminated together. A multilayered ceramic structure is formed by laminating green sheets alternately with patterns of metal-based paste between green sheets. Metal patterns separated by glass sheets are connected by through-holes or vias in the green sheets which are filled with the copper-based paste. For a ceramic structure for use as a semiconductor chip substrate, the metal pattern is extended to at least one surface of the composite structure.

The laminated structure is heated to the burn-out temperature at a rate which does not disturb the integrity of the substrate. If burn-out is too rapid. plasticizers contained in the binder in the green sheets will come off too rapidly causing blisters and resulting in delamination of the green laminate. The laminate is maintained at the burn-out temperature for a sufficient time to decompose and eliminate the binders in the green sheets and metal-based paste. The temperature must not be high enough to melt the metal-based conductor pattern and must not be high enough to cause coalescence of the glass particles. A requirement for binder removal is that the ceramic body remain porous until at residues are removed. If the glass particles in the green laminate begin to coalesce before the binders are burned-out, the products of the binder decomposition become trapped in the ceramic: 1) leaving carbon residues which increase the ceramic dielectric constant, 2) forming pores in the glass ceramic preventing its complete densification and 3) delaminating the green laminate if the pressure of the trapped products is great enough.

It was discovered, in accordance with this invention that alternate oxidizing and reducing atmospheres can be used to oxidize carbon-containing residues of fired polymers while forming an interface region about electrically conducting patterns, preferably oxidizable metal patterns. Accordingly, a process has been developed to remove polymer binders, e.g., polyvinylbutyral, from glass-ceramic/metal multilayer substrates based on this concept. The process involves heating a laminated assembly of green ceramic layers, with a metal conductor forming pattern first in an inert ambient, e.g., $N_2$, at a rate of about 1 to about 4° C. per minute to a burn-out temperature of from about 100° C. to about 500° C., preferably from about 200° C. to about 300° C., holding for about 3 to about 6 hours to burn out the polymer binder material, followed by changing the ambient to an oxidizing ambient, preferably containing at least a trace amount of oxygen, most preferably from about 1% to about 5% air being suitable, with about a 15 minute hold to remove some residual binder and controlled oxidation of the metal patterns, with subsequent heating in a reducing atmosphere, preferably containing hydrogen, in the same temperature range for about 15 minutes. A suitable reducing atmosphere is one containing at least 5% hydrogen, preferably forming gas which is a mixture of 90% nitrogen and 15% hydrogen. Other suitable reducing ambients are various concentration of hydrogen in nitrogen including pure hydrogen. The hold times are determined by the surface materials and for the ceramic precursor and electrical conductor forming composition. It is within the skill of the art to determine hold times and temperatures for surface combustions. It is within the skill of the art to determine the appropriate thickness of the interface region for the particular materials used and for the particular use contemplated.

FIG. 1 is an example of a firing schedule for a multilayer laminate of green glass sheets with copper conductor patterns disposed between the green glass sheets and with copper conductors extending through the green glass sheets to inter-connect conductor patterns on adjacent green glass sheets. The ceramic is of the type described in the patent of Kumar et al., the teaching of which was incorporated herein by reference above.

Figure 2:
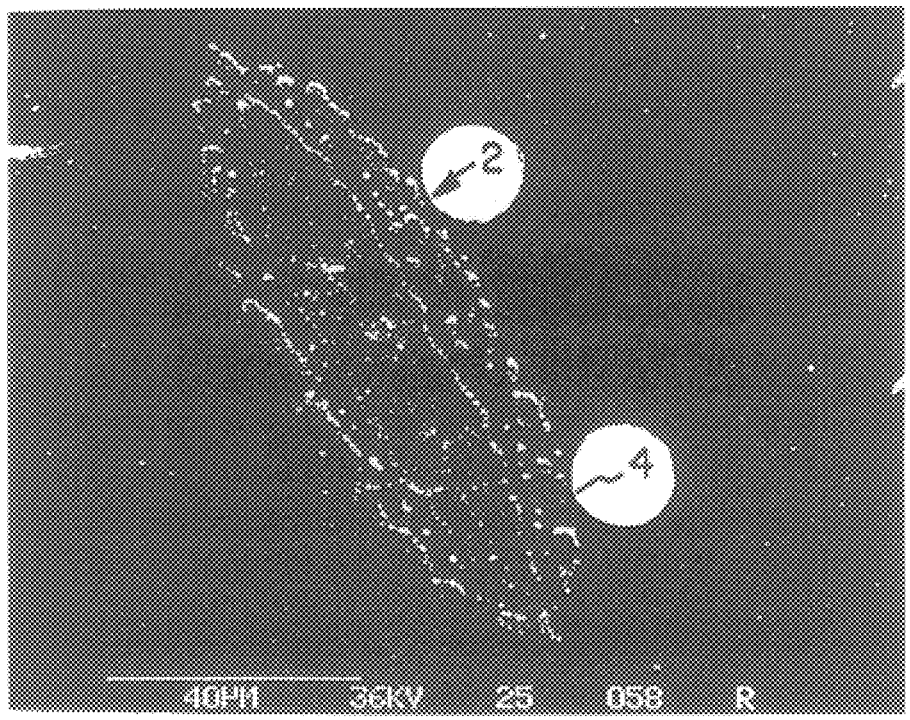
FIG. 2 is a scanning electron micrograph showing the interface region formed by the schedule of FIG. 1.

FIG. 2 is a scanning electron micrograph of a cross-section through a metal/ceramic structure fabricated according to the schedule of FIG. 1 showing a metal line 2 which is surrounded by an interface region 4. The central light region of FIG. 2 is the metal line 2 and the region 4 which surrounds this light region is made up of light and dark regions; the light regions are metal particles of various sizes and the dark regions between the metal particles in the interlayer region 4 and the dark region surrounding the entire metal line 2 is the ceramic material. The thickness of the interface region is 8 microns.

A dispersive X-ray analysis of the interface region 4 of FIG. 2 shows peaks characteristic of copper, magnesium, aluminum and silicon which indicate that the interface region is composed of copper particles of metal and the surrounding glass ceramic.

It should be noted that for conditions of safety it may be undesirable to mix a hot oxygen containing atmosphere with a hot hydrogen containing atmosphere. Therefore, it may be desirable to purge the chamber in which the heat cycle is being conducted by evacuating it for a period of time for example of about 15 minutes or to introduce nitrogen gas for a period of time of about 15 minutes before introducing the next oxidizing or reducing gas environment. Commonly used furnaces for fabrication of ceramics can be readily modified to provide the inlet source locations for the oxidizing gas, for the reducing gas, for the nitrogen gas and for the evacuation. An example of a commonly used furnace is model 921 manufactured by Astro Industries, Inc. Santa Barbara, Calif.

It has been observed that as one gas is being replaced by another gas there can be a drop in temperature of the furnace by as little as 10° C. and as much as a few hundred degrees because of the introduction into the hot chamber of a cold gas. This can be avoided by preheating the gas to the chamber temperature before introduction therein. The temperature reductions created by the introduction of a cold gas into a heated furnace depend on the holding temperature, the substrate materials and the composition of the furnace.

As described herein above the process of the present invention substantially avoids voids about conductors in the multilevel structure which can be caused by thermal cycling during fabrication of the structure and thermal cycling during use of the structure.

Figure 3:
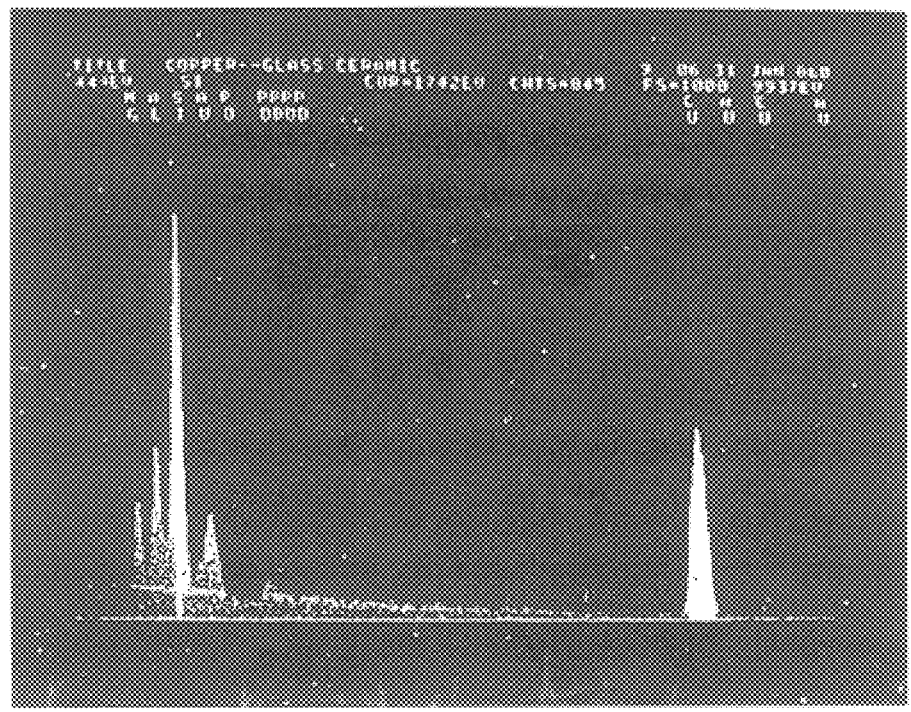

The multilayered substrate fabrication process for the structure corresponding to FIGS. 1, 2 and 3 involves the following illustrative basic steps:

STEP 1

The cullet of the chosen crystallizable glass is a cordierite type glass disclosed in U.S. Pat. No. 4,301,324 to Kumar et al. is ground to average particle sizes in the range of 2 to 7 micrometers. The grinding can be done in two steps, a preliminary dry or wet grinding to 400 mesh particle size followed by further grinding with suitable organic binders and solvents until the average particle size is reduced to lie between 2 to 7 micrometers and a castable slurry or slip is obtained. A single stage prolonged grinding of the cullet in the medium of the binder and solvent, until the desired particles sizes are obtained can be used. In the latter case, a filtering step may be necessary to remove oversized particles.

By way of example, a suitable binder is polyvinylbutyral resin with a plasticizer such as dipropylglycol-dibenzoate (e.g. the commercial Benzoflex plasticizer of the Tennessee Products and Chemical Corp.). Other suitable polymers are polyvinyl acetate, selected ones of the acrylic resins, and the like. Similarly other suitable plasticizers such as dioctylphthalate, dibutyl phthalate, and the like, can also be used. The purpose of adding an easily evaporable solvent is (1) to initially dissolve the binder so as to enable it to coat the individual glass particles, and (2) to adjust the rheology of the slip or slurry for good castability. A particularly effective solvent for the purpose of this example are the dual solvent systems of U.S. Pat. No. 4,104,245, specifically the dual methanol/-methyl isobutylketone (in a 5/8 weight ratio) solvent system.

STEP 2

The slip or slurry prepared as in Step 1 is cast, in accordance with conventional techniques, into thin green sheets, (e.g. about 750–250 micrometers (3–10 mils) thick), preferably by doctor-blading techniques.

STEP 3

The cast sheets arc blanked to the required dimensions and via holes arc punched through them in the required configuration.

STEP 4

A metallizing paste of copper is extruded or screened into the via holes in the individual sheets.

STEP 5

A suitable copper paste or ink is then screen-printed onto the individual green sheets of Step 4, in the required conductor patterns.

STEP 6

A plurality of sheets, prepared as in Step 5, are laminated together in registry in a laminating press;

The temperature and pressure employed for lamination should be such as to cause (1) the individual green sheets to bond to each other to yield a monolithic green substrate, and (2) to cause the green sheet to sufficiently flow and enclose the conductor patterns.

STEP 7

Firing of the laminate to the sintering temperatures to accomplish binder removal, densification or coalescence of the glass particles, and conversions to a glass-ceramic by crystallization with concurrent sintering of the metal particles, in the conductor patterns, the dense copper-zinc lines and vias.

A typical firing schedule is shown in FIG. 1. For this example, the green laminate is heated at a rate of 4° C./min. in $N_2$ to hold temperature of 230° C. The laminate is held at this temperature for about 1 hour. The $N_2$ ambient is maintained at which point the heating is again elevated at a rate of 4° C./min. to a hold temperature of 370° C., which temperature is held for about 4 hours, after which the temperature is again raised in an $N_2$ ambient at a rate of about 4° C./min to 500° C. and held there for about 1 hours. The temperature is reduced to ambient at a rate of about 25° C./min in an ambient of $N_2$. The temperature is then increased at a rate of about 1.25°/min in an ambient of $N_2$ to a hold temperature of about 600° C. At 600° C. the substrate is held for about 15 min. in air, then held for 15 min. in forming gas(95% $N_2$, 5% $H_2$), then held in $N_2$ for 15 min. to remove residual forming gas. As shown in FIG. 4, the chamber containing the substrate may be evacuated to a pressure of form $5 \times 10^{-5}$ to $2 \times 10$&superminus.sup6 Torr for about 10 minutes between each of the air forming gas and $N_2$ holds. The cycle of air/forming gas/$N_2$ gas is repeated three times. The temperature is reduced to ambient at a rate of 2.5° C./mm. The rates of increase and decrease in temperature arc not limiting and can be varied according to the type ceramic and metal used.

STEP 8

In a final step the laminate is sintered under pressure of about 2000 lbs/$M^2$ for a time of about 45 minutes at a temperature of about 950° C. in an atmosphere of $N_2$ Pressure is applied by placing the laminate between the two platterns.

In summary, applicants have discovered that separations between metal bodies embedded within ceramic bodies can be avoided by the creation of an interface region between the metal body and the ceramic body wherein the interface region is a combination of metal particles and ceramic material. This interface region has a TCE which is intermediate between the metal body and the ceramic body and, therefore, is capable of absorbing the expansion differentials between the metal and ceramic bodies. Furthermore, it has been found that this interface region is hermetic. This method produces structures which have a variety of uses in particular uses as electronic device packaging substrates having embedded conductors which are substantially hermetically isolated from the external environment and substantially free of spaces or voids about the conductors.

While the invention has been illustrated and described with respective preferred embodiments, it is to be understood that the invention is not limited to the precise constructions they were disclosed, the right is reserved to all changes and modifications coming within the scope of the invention as defined herein and in the appended claims.

What is claimed is:

1. A method comprising:
   providing a combination of a body of a green precursor to a ceramic material and a body of an electrical conductor forming material embedded within said body of said green precursor;
   sintering said combination, including exposing said combination to a plurality of cycles of an oxidizing environment and a reducing environment to form a structure having an interface region between a sintered ceramic body and an electrically conductive body; and
   said interface region being a mixture of particles of said electrically conductive material and particles of ceramic material said interface region has a thickness of from about 5 microns to about 10 microns.

2. A The method of claim 1, wherein said electrically conducting material is a metal.

3. The method of claim 2, wherein said metal is an oxidizable metal.

4. The method of claim 2, wherein said metal is selected from the groups consisting of Cu, Ag, Au, W, Pi and Mo.

5. The method of claim 1, wherein said ceramic is an aggregate of randomly oriented crystallites having interstices therebetween optionally containing uncriptalized material.

6. The method of claim 1, wherein at least a part of said body of electrically conducting material is embedded within said ceramic body.

7. The method of claim 1, wherein said ceramic body contains crystal phases selected from the group consisting of alumina, cordierite, spodumene, eucryptic, enstatite, celsian, wollastimite, willemite, anorthite, lithium disilicate, lithium metasilicate, mullite, combinations thereof, and combinations thereof with a material selected from the group consisting of a birosilicate glass and lead glass.

8. The method of claim 1, wherein said combination is a body of ceramic material having therein a plurality of substantial planar layers of electrically conducting patterns of metal, adjacent layers of said plurality being electrically interconnected by conducting metal patterns substantially perpendicular to said substantially planar layers, therebeing electrically conducting patterns extending to a surface of said structure.

9. The method of claim 7, wherein said body of said electrical conductor forming material forms electrically conductive patterns further including mounting an electronic device in electrical connection to said electrically conducting patterns extending to said surface of said structure.

10. The method of claim 8, wherein said combination is incorporated in an electronic computer so that there is substantially no separation or cracking of said result of thermal cycling of said combination.

11. The method of claim 1, wherein said structure is hermetic.

12. The method of claim 1, wherein said body of ceramic material has a first thermal coefficient of expansion, said body of electrically conducting material has a second thermal coefficient of expansion and wherein said interface region has a thermal coefficient of expansion intermediate of said first thermal coefficient of expansion and said second thermal coefficient of expansion.

13. The method of claim 1, further including as a part of said sintering, pressing said combination to force portions of said green ceramic body to interpenetrate around said particles of said electrically conducting material.

14. The method of claim 1, wherein said reducing environment contains hydrogen.

15. The method of claim 1, wherein said oxidizing environment contains oxygen.

16. The method of claim 1, wherein said combination is exposed to inert environment between said oxidizing environment and said reducing environment.

17. The method of claim 1, wherein said combination is in a chamber which is evacuated between said oxidizing environment and said reducing environment.

18. A method comprising:

providing a combination of a body of a green precursor to a ceramic material and a body of an electrical conductor forming material embedded within said body of said green precursor;

sintering said combination to form a sintered combination, including exposing said combination to a plurality of cycles of an oxidizing environment and a reducing environment to form a structure having an interface region between a sintered ceramic body and an electrically conductive body;

said interface region being a mixture of particles of said electrically conductive material and particles of ceramic material said interface region has a thickness of from about 5 microns to about 10 microns;

said interface region is hermetic;

said combination is a body of ceramic material having therein a plurality of substantial planar layers of electrically conducting patterns of metal, adjacent layers of said plurality being electrically interconnected by conducting metal patterns substantially perpendicular to said substantially planar layers, there being electrically conducting patterns extending lo a surface of said structure;

wherein said body of ceramic material has a first thermal coefficient of expansion, said body of electrically conducting material has a second thermal coefficient of expansion and wherein said interface region has a thermal coefficient of expansion intermediate of said first thermal coefficient of expansion and said second thermal coefficient of expansion; so that there is substantially no separation or cracking of said interface region between said ceramic and said conductors as a result of thermal cycling of said combination;

incorporating said combination in an electronic computer, said combination is hermetic.

19. A method according to any one of claims 1, 2 to 16 or 17 wherein there is substantially no separation or cracking of said interface region between said ceramic and said electrically conductive body as a result of thermal cycling of said combination.

* * * * *